United States Patent
Bailey, III et al.

(10) Patent No.: US 6,320,320 B1
(45) Date of Patent: Nov. 20, 2001

(54) METHOD AND APPARATUS FOR PRODUCING UNIFORM PROCESS RATES

(75) Inventors: Andrew D. Bailey, III, Pleasanton; Alan M. Schoepp, Santa Cruz; Andras Kuthi, Thousand Oaks, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/440,418

(22) Filed: Nov. 15, 1999

(51) Int. Cl.$^7$ .................................................. H01J 7/24
(52) U.S. Cl. ........................ 315/111.51; 315/111.21; 315/111.41; 315/111.81; 315/111.91; 156/345; 219/121.43
(58) Field of Search .................. 315/111.51, 111.21, 315/111.41, 111.81, 111.91; 156/345; 219/121.43

(56) References Cited

U.S. PATENT DOCUMENTS

| | | | |
|---|---|---|---|
| 4,948,458 | 8/1990 | Ogle | 156/643 |
| 4,990,229 | 2/1991 | Campbell et al. | 204/298.06 |
| 5,091,049 | 2/1992 | Campbell et al. | 156/643 |
| 5,122,251 | 6/1992 | Campbell et al. | 204/298.06 |
| 5,226,967 | 7/1993 | Chen et al. | 118/723 |
| 5,401,350 | 3/1995 | Patrick et al. | 156/345 |
| 5,421,891 | 6/1995 | Campbell et al. | 118/723 R |
| 5,429,070 | 7/1995 | Campbell et al. | 118/723 R |
| 5,540,800 | 7/1996 | Qian | 156/345 |
| 5,587,038 | 12/1996 | Cecchi et al. | 156/345 |
| 5,669,975 | 9/1997 | Ashtiani | 118/723 I |
| 6,028,285 | * 2/2000 | Khater et al. | 315/111.21 |
| 6,229,264 | * 5/2001 | Ni et al. | 315/111.51 |

FOREIGN PATENT DOCUMENTS 0 838 843    4/1998    (EP) .............. H01J/37/32

* cited by examiner

*Primary Examiner*—Don Wong
*Assistant Examiner*—Jimmy T. Vu
(74) *Attorney, Agent, or Firm*—Beyer Weaver & Thomas, LLP

(57) ABSTRACT

A plasma processing apparatus for processing a substrate with a plasma is disclosed. The apparatus includes a first RF power source having a first RF frequency, and a process chamber. Further, the apparatus includes a substantially circular antenna operatively coupled to the first RF power source and disposed above a plane defined by the substrate when the substrate is disposed within the process chamber for processing. The substantially circular antenna being configured to induce an electric field inside the process chamber with a first RF energy generated by the first RF power source. The substantially circular antenna including at least a first pair of concentric loops in a first plane and a second pair of concentric loops in a second plane. The first pair of concentric loops and the second pair of concentric loops being substantially identical and symmetrically aligned with one another. The substantially circular antenna forming an azimuthally symmetric plasma inside the process chamber. The apparatus also includes a coupling window disposed between the antenna and the process chamber. The coupling window being configured to allow the passage of the first RF energy from the antenna to the interior of the process chamber. The coupling window having a first layer and a second layer. The second layer being configured to substantially suppress the capacitive coupling formed between the substantially circular antenna and the plasma. The substantially circular antenna and the coupling window working together to produce a substantially uniform process rate across the surface of the substrate.

40 Claims, 4 Drawing Sheets

METHOD AND APPARATUS FOR PRODUCING UNIFORM PROCESS RATES

CROSS-REFERENCED TO RELATED CASES

This application is related to following concurrently filed U.S. Patent Applications:

Application Ser. No.: 09/439,661 entitled "IMPROVED PLASMA PROCESSING SYSTEMS AND METHODS THEREFOR";

Application Ser. No.: 09/470,236 entitled "PLASMA PROCESSING SYSTEM WITH DYNAMIC GAS DISTRIBUTION CONTROL";

Application Ser. No.: 09/439,675 entitled "TEMPERATURE CONTROL SYSTEM FOR PLASMA PROCESSING APPARATUS";

Application Ser. No.: 09/440,794 entitled "MATERIALS AND GAS CHEMISTRIES FOR PLASMA PROCESSING SYSTEMS";

Application Ser. No.: 09/439,759 entitled "METHOD AND APPARATUS FOR CONTROLLING THE VOLUME OF PLASMA".

Each of the above-identified patent application is incorporated herein by reference.

BACKGROUND OF THE INVENTION

The present invention relates to apparatus and methods for processing substrates such as semiconductor substrates for use in IC fabrication or glass panels for use in flat panel display applications. More particularly, the present invention relates to improved plasma processing systems that are capable of processing substrates with a high degree of processing uniformity across the substrate surface.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and glass panels.

During, processing, multiple deposition and/or etching steps are typically employed. During deposition, materials are deposited onto a substrate surface (such as the surface of a glass panel or a wafer). For example, deposited layers such as various forms of silicon, silicon dioxide, silicon nitride, metals and the like may be formed on the surface of the substrate. Conversely, etching, may be employed to selectively remove materials from predefined areas on the substrate surface. For example, etched features such as vias, contacts, or trenches may be formed in the layers of the substrate.

One particular method of plasma processing uses an inductive source to generate the plasma. FIG. 1 illustrates a prior art inductive plasma processing reactor 100 that is used for plasma processing. A typical inductive plasma processing reactor includes a chamber 102 with an antenna or inductive coil 104 disposed above a dielectric window 106. Typically, antenna 104 is operatively coupled to a first RF power source 108. Furthermore, a gas port 110 is provided within chamber 102 that is arranged for releasing gaseous source materials, e.g., the etchant source gases, into the RF-induced plasma region between dielectric window 106 and a substrate 112. Substrate 112 is introduced into chamber 102 and disposed on a chuck 114, which generally acts as an electrode and is operatively coupled to a second RF power Source 116.

In order to create a plasma, a process gas is input into chamber 102 through gas port 110. Power is then supplied to inductive coil 104 using first RF power source 108. The supplied RF energy couples through the dielectric window 106 and a large electric field is induced inside chamber 102. More specifically, in response to the electric field, a circulating current is induced in chamber 102. The electric field accelerates the small number of electrons present inside the chamber causing them to collide with the gas molecules of the process gas. These collisions result in ionization and initiation of a discharge or plasma 118. As is well known in the art, the neutral gas molecules of the process gas when subjected to these strong electric fields lose electrons, and leave behind positively charged ions. As a result, positively charged ions, negatively charged electrons and neutral gas molecules (and/or atoms) are contained inside the plasma 118. As soon as the creation rate of free electrons exceeds their loss rate, the plasma ignites.

Once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 112. Correspondingly, when bottom electrode 114 is powered, ions tend to accelerate towards the substrate where they, in combination with neutral species, activate the etching reaction.

One problem that has been encountered with inductive plasma systems, such as the one mentioned above, has been variations in the etch performance across the substrate, e.g., a non-uniform etch rate. That is, one area of the substrate gets etched differently than another area. As a result, it is extremely difficult to control the parameters associated with the integrated circuit, i.e., critical dimensions, aspect ratios, and the like. Additionally, a non-uniform etch rate may lead to device failure in the semiconductor circuit, which typically translates into higher costs for the manufacturer. Moreover, there also exist other issues of concern such as the overall etch rate, etch profile, micro-loading, selectivity, and the like.

In recent years, it has been found that these non-uniform etch rates may be the result of variations in the plasma density across the surface of the substrate, i.e., a plasma that has regions with greater or lesser amounts of reactive species (e.g., positively charged ions). While not wishing to be bound by theory, it is believed that the variations in plasma density are created by asymmetries that are found in the power transmission characteristics of the power coupling, e.g., antenna, the dielectric window, and/or plasma. If the power coupling is asymmetric, it stands to reason that the circulating current of the induced electric field will be asymmetric, and therefore the ionization and initiation of the plasma will be asymmetric. As a result, variations in the plasma density will be encountered. For example, some antenna arrangements induce a current that is strong in the center of the coil, and weak at the outer diameter of the coil. Correspondingly, the plasma tends to congregate towards the center of the process chamber (as shown in FIG. 1 by plasma 118).

The standard technique for overcoming an asymmetric power coupling has been to compensate or balance out the asymmetries. For example, using a pair of planar antennas to increase the current density at weak current areas, joining radial members to a spiral antenna to form more circular loops at different radii, varying the thickness of the dielectric window to decrease the current density at strong current areas. However, these balancing techniques tend not to provide an azimuthally symmetric power coupling. That is, they still tend to have azithmuthal variations that lead to variations in the plasma, which makes it difficult to obtain etch uniformity.

Moreover, most antenna arrangements used today form some type of capacitive coupling between the antenna and the plasma. Capacitive coupling is created by a voltage drop between the antenna and the plasma. The voltage drop typically forms a sheath voltage at or near the coupling window. For the most part, the sheath voltage tends to act like the bottom electrode (powered). That is, the ions in the plasma tend to be accelerated across the sheath, and therefore accelerate towards the negatively charged coupling window. As a result, the accelerating ions tend to bombard the surface of the coupling window.

These bombarding ions will have substantially the same effect on the coupling window as they do on the substrate, i.e., they will either etch or deposit material on the coupling window surface. This may produce undesirable and/or unpredictable results. For example, deposited material may accumulate on the coupling window and become the source of harmful particulate, especially when material flakes off onto the substrate surface. Removing material from the coupling window will have a similar effect. Eventually, the increase or decrease in thickness will cause process variation, for example, in the power transmission properties of the power coupling (e.g., antenna, dielectric window, plasma). As mentioned, process variation may lead to non-uniform processing, which lead to device failure in the semiconductor circuit.

In view of the foregoing, there are desired improved methods and apparatuses for producing uniform processing at the surface of the substrate. There are also desired improved methods and apparatuses for reducing the capacitive coupling between the antenna and the plasma.

SUMMARY OF THE INVENTION

The invention relates, in one embodiment to a plasma processing apparatus for processing a substrate with a plasma. The apparatus includes a first RF power source having a first RF frequency. The apparatus further includes a process chamber. The apparatus additionally includes a substantially circular antenna operatively coupled to the first RF power source and disposed above a plane defined by the substrate when the substrate is disposed within the process chamber for processing. The substantially circular antenna being configured to induce an electric field inside the process chamber with a first RF energy generated by the first RF power source. The substantially circular antenna including at least a first pair of concentric loops in a first plane and a second pair of concentric loops in a second plane. The first pair of concentric loops and the second pair of concentric loops being substantially identical and symmetrically aligned with one another. The substantially circular antenna forming an azimuthally symmetric plasma inside the process chamber.

The apparatus also includes a coupling window disposed between the antenna and the process chamber. The coupling window being configured to allow the passage of the first RF energy from the antenna to the interior of the process chamber. The coupling window having a first layer and a second layer. The second layer being configured to substantially suppress the capacitive coupling formed between the substantially circular antenna and the plasma. The substantially circular antenna and the coupling window working together to produce a substantially uniform process rate across the surface of the substrate.

The invention relates, in another embodiment to a substantially circular antenna arrangement for processing a substrate inside a process chamber. The antenna arrangement being operatively coupled to a first RF power source and disposed above a plane defined by the substrate when the substrate is disposed within the process chamber for processing. The antenna arrangement includes a first pair of concentric loops in a first plane and a second pair of concentric loops in a second plane. The second pair of concentric loops being operatively coupled to the first pair of concentric loops. The second pair of concentric loops being substantially identical and symmetrically aligned with the first of concentric loops. The second pair of concentric loops being proximate to the first pair of concentric loops, and the first pair of concentric loops being disposed above the second pair of concentric loops. The substantially circular antenna arrangement forming an azimuthally symmetric electric field inside the process chamber with a first RF energy generated by the first RF power source, wherein the azimuthally symmetric electric field forms a substantially azimuthally symmetric plasma, which produces a substantially uniform process rate across the surface of the substrate.

The invention relates, in another embodiment to a coupling window arrangement for processing a substrate with a plasma inside a process chamber. The coupling window being disposed between an antenna and the process chamber. The coupling window being configured to allow the passage of a first RF energy from the antenna to the interior of the process chamber. The process forming capacitive coupling between the antenna and the plasma. The arrangement including a first layer being formed from a dielectric material, and a second layer being formed from a conductive material that is substantially resistant to the plasma present within the process chamber during processing. The second layer being bonded to the first layer, and the second layer forming part of the inner peripheral surface of the process chamber. The second layer also being configured to substantially suppress the capacitive coupling formed between the antenna and the plasma during processing.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

Figure 1:
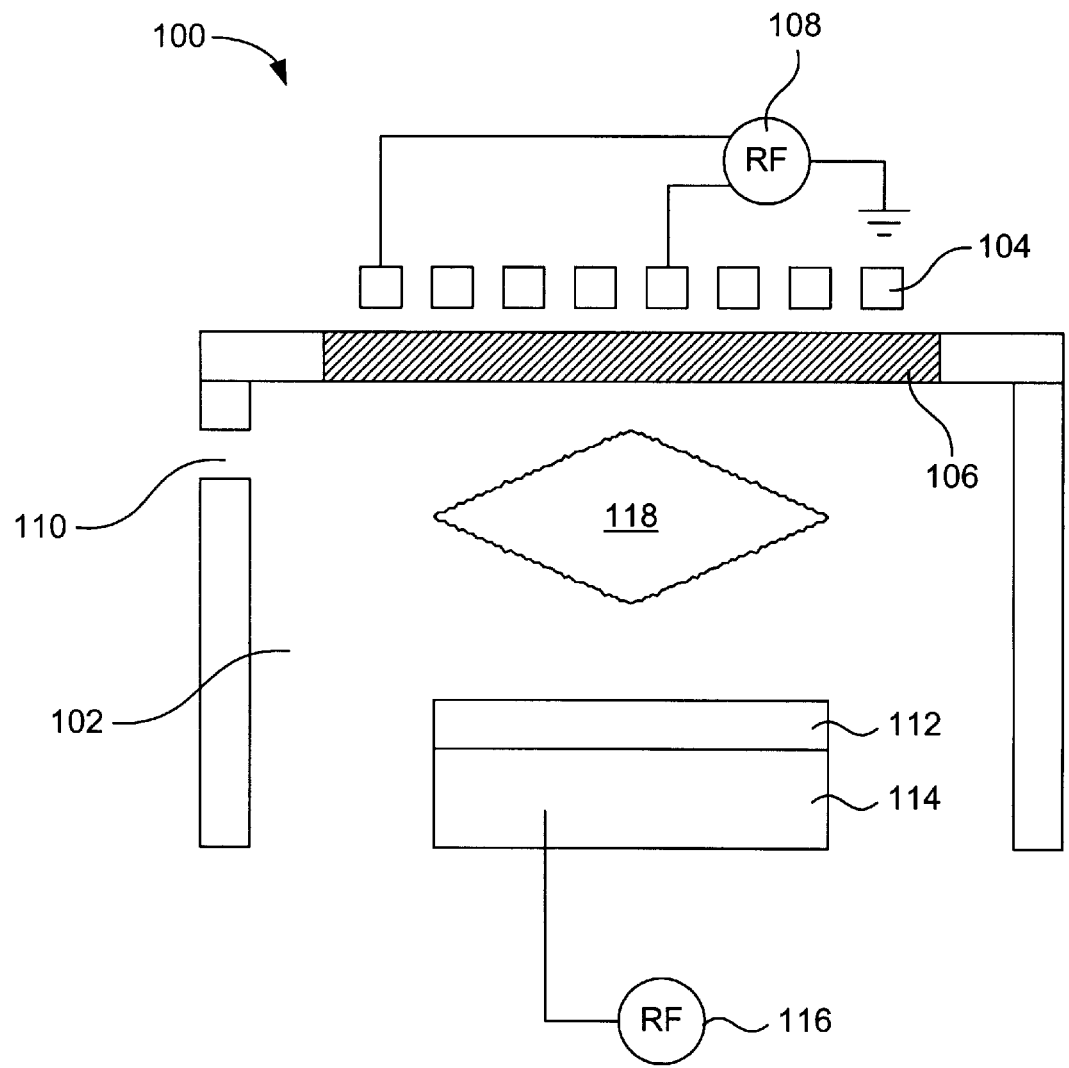
FIG. 1 illustrates a prior art inductive plasma processing reactor that is used for plasma processing.

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In processing substrates, one of the most important parameters that process engineers strive to improve is process uniformity. As the term is employed herein, etch uniformity refers to the uniformity of the entire etch process across the substrate surface including etch rate, microloading, mask selectivity, underlayer selectivity, critical dimension control, and profile characteristics like sidewall angle and roughness. If the etch is highly uniform, for example, it is expected that the etch rates at different points on the substrate tend to be substantially equal. In this case, it is less likely that one area of the substrate will be unduly over-etched while other areas remain inadequately etched.

The present invention provides a plasma processing system for processing substrates that is capable of producing a uniform etch. The plasma processing system includes an RF power source and a process chamber. The plasma processing system further includes a substantially circular antenna operatively coupled to the RF power source and disposed above a plane defined by a substrate when the substrate is disposed within the process chamber for processing. The substantially circular antenna is configured to induce an electric field inside the process chamber with RF energy generated by the RF power source. The substantially circular antenna has at least a first pair of concentric loops in a first plane and a second pair of concentric loops in a second plane. The first pair of concentric loops and the second pair of concentric loops are substantially identical and symmetrically aligned with one another along a common axis.

The plasma processing system further includes a coupling window disposed between the antenna and the process chamber. The coupling window is configured to allow the passage of RF energy from the antenna to the interior of the process chamber. Further, the coupling window has a first layer and a second layer. The second layer is configured to reduce the voltage drop formed between the window and the plasma by absorbing at least a portion of the voltage that passes through the coupling window. The substantially circular antenna and said coupling window are arranged to work together to form an azimuthally symmetric plasma inside the process chamber that produces a substantially uniform process rate across the surface of the substrate.

In accordance with one aspect of the present invention, process uniformity across the substrate surface is achieved by providing an improved antenna arrangement configured for producing a uniform plasma. As mentioned, power is supplied to an antenna to induce an electric field and, consequently, a circulating electric current inside a process chamber. Correspondingly, the electric field accelerates the electrons in the process chamber causing them to collide with the gas molecules of the process gas, which as a result ionizes and initiates the plasma.

Following the creation of the plasma, power is supplied to a lower electrode and the ions are accelerated towards the substrate. The accelerated ions and neutral reactants at the surface of the substrate react with the materials disposed on the substrate surface and therefore process the substrate. In general, when the density of the plasma is greater at one area of the substrate, a non-uniform process rate will be produced. Accordingly, the improved antenna arrangement is configured to reduce these plasma variations by inducing an azimuthally symmetric electric field, and therefore produce a more uniform process rate.

In one embodiment, the improved antenna is configured to produce a circulating current that is azimuthally symmetric. While not wishing to be bound by theory, it is believed that transmission line characteristics of the power coupling create azimuthal variations in the circulating current in response to the induced electric field. These transmission line characteristics tend to produce standing waves that form fluctuating areas of high and low voltage along the length of the antenna, which as a result form fluctuating areas of high and low current densities in the induced electric field, i.e., when the voltage is high, the current is low and when the voltage is low, the current is high. As is well known to those skilled in the art, power deposition into the plasma depends on the current density. For example, where the current density is high the plasma density tends to be high and where the current density is low the plasma density tends to be low. Accordingly, an azimuthally asymmetric plasma is typically produced when the current density has fluctuating areas of high and low current.

To be more specific, when the wavelength of the RF energy is smaller than the length of the antenna more nodes will appear in the standing wave pattern. Generally, standing waves are governed by the equation, antenna electrical length=½ (wavelength)*n, where n=the number of nodes. Most antenna arrangements are about 1½ to about 2½ wavelengths in length, and as a result produce about 3 to 5 nodes. These nodes correspond to the low voltages mentioned above.

The improved antenna overcomes this disadvantage by being configured to behave as a lumped circuit element in the power delivery system rather than a transmission line. That is, the improved antenna is configured to have an apparent length that is smaller than the wavelength of the RF energy at the operating frequency. As a result, the amount of nodes is reduced and therefore, the azimuthal variations of the induced current are substantially eliminated and the transmission line analogy no longer holds.

In one embodiment, the improved antenna arrangement is a multi-turn antenna that acts like a single turn antenna. The multi-turn antenna is a substantially single conductive element that includes a plurality of loops, which are closely wound and stacked together. By closely winding and stacking the loops together, the overall size (e.g., outer diameter) of the antenna may be made smaller without impacting the strength of the induced circulating current. Further, by decreasing the size of the antenna the overall length of the antenna can be made smaller, which as a result reduces the transmission line characteristics of the antenna. Further still, because the loops are disposed proximate to each other, the radial variation typically found between turns may also be reduced. Correspondingly, the improved antenna arrangement advantageously induces a circulating current that is azimuthally symmetric. Accordingly, the azimuthally symmetric circulating current tends to form an azimuthally symmetric plasma, which as a result, tends to produce uniform plasma processing at the surface of the substrate.

Another aspect of the multi-turn stacked antenna arrangement is the self-shielding characteristics, i.e. the plasma is shielded from the antenna terminal voltage by the turns adjacent to the window. This leads to a significant reduction in capacitive coupling and subsequent window erosion, both of which, will be discussed in greater detail below.

In accordance with another aspect of the present invention, an improved coupling window is configured to reduce the capacitive coupling that occurs between the antenna and the plasma. Most power coupling arrangements (e.g., antenna, coupling window, and plasma) create some capacative coupling between the antenna and the plasma. Capacitive coupling is created by a voltage drop that occurs between the antenna and the plasma. This voltage drop typically creates a sheath voltage proximate to the coupling window. As is well known to those skilled in the art, the sheath voltage may lead to additional variations in the plasma, for example, the sheath voltage may push the plasma away from the window causing a reduction in the inductive coupling coefficient. Additionally, the sheath voltage may even produce significant particle contamination due to the bombardment of the ions against the coupling window. Moreover, any power used up by ion bombardment of the window is typically unavailable for plasma generation, which correspondingly causes a lower plasma density for a given power.

In order to reduce the capacitive coupling between the antenna and the plasma, the improved coupling window is configured to include a dielectric layer and a shielding layer that are disposed together. The shielding layer, which is the layer disposed inside the process chamber, is preferably configured to act as a electrostatic shield that directs the voltage away from the surface of the coupling window. The shielding layer essentially suppresses the capacitive coupling to the plasma. Furthermore, the shielding layer is configured to eliminate the capacitive (electrostatic, gradient of a potential) electric field, while leaving the inductive (Curl B, grad F=0 type) electric field substantially unchanged. That is, the coupling window is configured to block direct capacitive coupling through the coupling window, while allowing the antenna to inductively form the plasma (without substantial losses to the shielding layer).

More specifically, the shielding layer is electrically isolated and formed from a conducting or semi-conducting material. Therefore, the voltage drop that would normally occur between the antenna and the plasma now occurs between the antenna and the shielding layer. Accordingly, the sheath voltage near the surface of the coupling window is substantially reduced, which as a result increases the inductive coupling coefficient and reduces the power loss due to the unproductive ion bombardment of the coupling window.

Furthermore, an ungrounded electrostatic shield will produce a uniform electrostatic field, shielding only the variations of the electrostatic fields over the area of the shield. This last feature may be used to facilitate striking of the plasma. Additionally, because the shielding layer is exposed to the interior of the process chamber, it is preferably formed from a material that can resist the thermal, chemical and physical effects of plasma processing.

The features and advantages of the present invention may be better understood with reference to the figures and discussions that follow.

Figure 2:
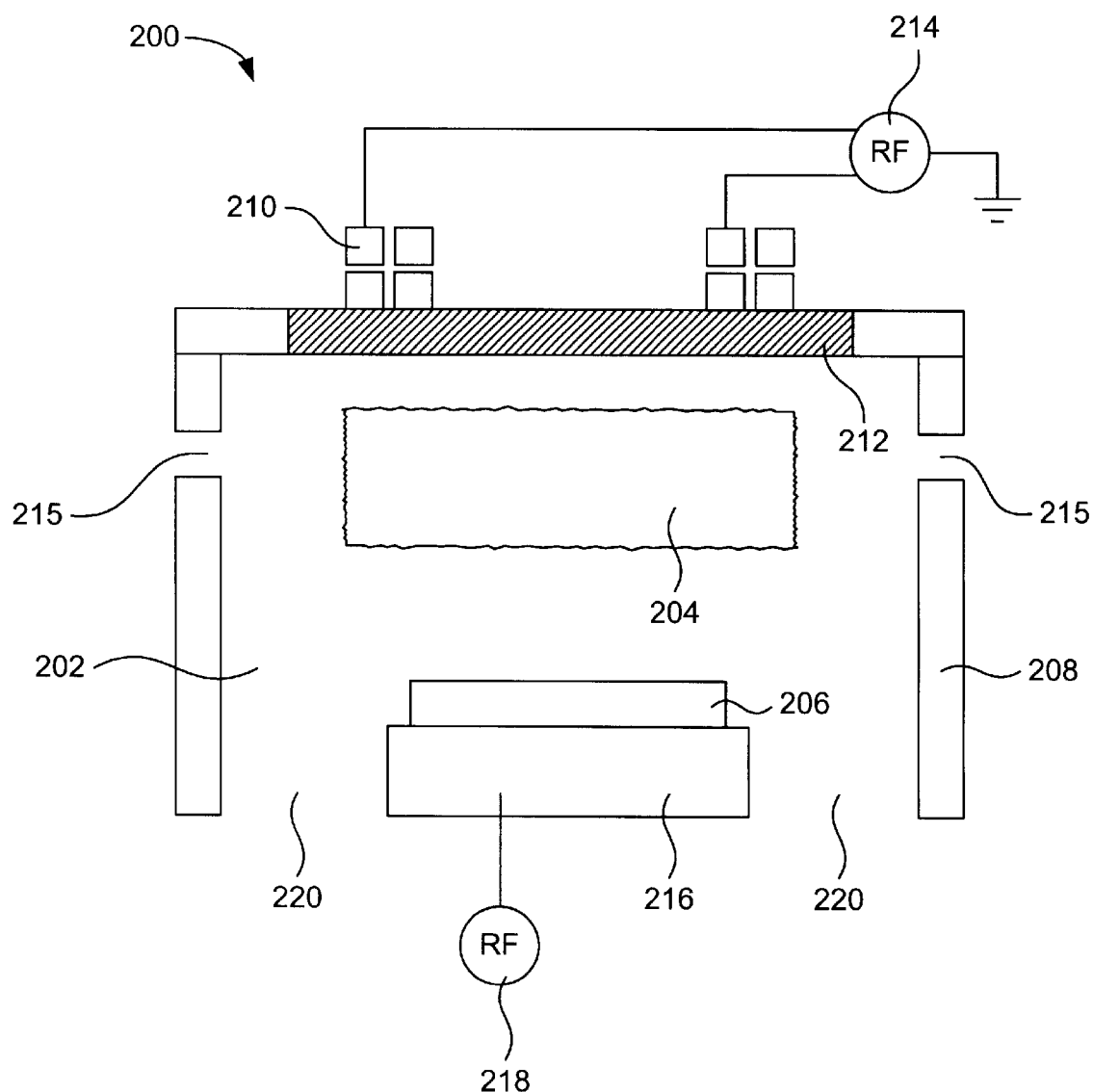
FIG. 2 illustrates a plasma processing system, including an antenna arrangement and a coupling window arrangement, in accordance with one embodiment of the present invention.

FIG. 2 illustrates, in accordance with one embodiment of the present invention, a plasma processing system 200, including a process chamber 202 within which a plasma 204 is both ignited and sustained for processing a substrate 206. Substrate 206 represents the work-piece to be processed, which may represent, for example, a semiconductor substrate to be etched, deposited, or otherwise processed or a glass panel to be processed into a flat panel display. Additionally, process chamber 202 is preferably arranged to be substantially cylindrical in shape, and have substantially vertical chamber walls 208. However, it should be noted that the present invention is not limited to the above and that various configurations of the process chamber may be used.

Plasma processing system 200 further includes an antenna arrangement 210 and a coupling window arrangement 212, which are configured to couple power to plasma 204. Antenna arrangement 210 is coupled to a first RF power supply 214 that is configured to supply antenna arrangement 210 with RF energy having a frequency in the range of about 0.4 MHz to about 50 MHz. Coupling window 212 is configured to allow the passage of the first RF energy from antenna arrangement 210 to the interior of said process chamber. Preferably, coupling window 212 is disposed between substrate 206 and antenna arrangement 210.

Further, antenna arrangement 210 should be sufficiently close to the coupling window to facilitate the formation of plasma 204. That is, the closer the antenna arrangement is to the coupling window, the greater the intensity of the current produced within the chamber. Further still, antenna arrangement 210 is preferably arranged to be co-axial with both process chamber 202, and substrate 206. It should be understood that a symmetric placement of the antenna arrangement may enhance the plasma uniformity across the substrate surface, however, it may not be required for all processes. Antenna arrangement 210 and coupling window 212 will be described in more detail below.

A gas injector 215 is typically provided within chamber 202. Gas injector 215 is preferably disposed around the inner periphery of chamber 202 and is arranged for releasing gaseous source materials, e.g., the etchant source gases, into the RF-induced plasma region between coupling window 212 and substrate 206. Alternatively, the gaseous source materials may also be released from ports built into the walls of the chamber itself or through a shower head arranged in the dielectric window. It should be understood that a symmetric distribution of gas may enhance the plasma uniformity across the substrate surface, although, it may not be required for all processes. An example of a gas distribution system that may be used in the examplary plasma processing system is described in greater detail in a co-pending patent application entitled, "PLASMA PROCESSING SYSTEM WITH DYNAMIC GAS DISTRIBUTION CONTROL", Application Ser. No. 09/470,236, filed on even date and incorporated herein by reference.

For the most part, substrate 206 is introduced into chamber 202 and disposed on a chuck 216, which is configured to hold the substrate during processing. Chuck 216 may represent, for example, an ESC (electrostatic) chuck, which secures substrate 206 to the chuck's surface by electrostatic force. Typically, chuck 216 acts as a bottom electrode and is preferably biased by a second RF power source 218. Additionally, chuck 216 is preferably arranged to be substantially cylindrical in shape and axially aligned with process chamber 202 such that the process chamber and the chuck are cylindrically symmetric. Chuck 216 may also be configured to move between a first position (not shown) for loading and unloading substrate 206 and a second position (not shown) for processing the substrate.

Still referring FIG. 2, an exhaust port 220 is disposed between chamber walls 202 and chuck 216. However, the actual placement of the exhaust port may vary according to the specific design of each plasma processing system. In cases where a high degree of uniformity is critical, however, a cylindrically symmetric exhaust port can be quite beneficial. Preferably, exhaust port 220 is configured for exhausting by-product gases formed during processing. Further, exhaust port 220 is coupled to a turbomolecular pump (not shown), typically located outside of chamber 202. As is well known to those skilled in the art, the turbomolecular pump maintains the appropriate pressure inside chamber 202.

Furthermore, in the case of semiconductor processing, such as etch processes, a number of parameters within the processing chamber need to be tightly controlled to maintain high tolerance results. The temperature of the processing chamber is one such parameter. Since the etch tolerance (and resulting semiconductor-based device performance) can be highly sensitive to temperature fluctuations of components in the system, accurate control therefore is required. By way of example, a temperature management system that may be used in the examplary plasma processing system for achieving temperature control is described in greater detail in a co-pending patent application entitled, "TEMPERATURE CONTROL SYSTEM FOR PLASMA PROCESSING APPARATUS", Application No. 09/439,675, filed on even date and incorporated herein by reference.

Additionally, another important consideration in achieving tight control over the plasma process is the material utilized for the plasma processing chamber, e.g., the interior surfaces such as the chamber wall. Yet another important consideration are the gas chemistries used to process the substrates. By way of example, both materials and gas chemistries that may be used in the examplary plasma processing system are described in greater detail in a co-pending patent application entitled, "MATERIALS AND GAS CHEMISTRIES FOR PLASMA PROCESSING SYSTEMS", Application Ser. No. 09/440,794, filed on even date and incorporated herein by reference.

In order to create a plasma, a process gas is input into chamber 202 through gas injector 215. Power is then supplied to antenna arrangement 210 using first RF power source 214, and a large electric field is induced inside chamber 202 through coupling window 212. The electric field accelerates the small number of electrons present inside the chamber causing them to collide with the gas molecules of the process gas. These collisions result in ionization and initiation of a discharge or plasma 204. As is well known to those skilled in the art, the neutral gas molecules of the process gas when subjected to these strong electric fields lose electrons, and leave behind positively charged ions. As a result, positively charged ions, negatively charged electrons and neutral gas molecules are contained inside plasma 204.

Once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 206. Correspondingly, when bottom electrode 216 is powered, ions tend to accelerate towards the substrate where they, in combination with neutral species, activate substrate processing, i.e., etching, deposition and/or the like.

For the most part, plasma 204 predominantly stays in the upper region of the chamber (e.g., active region), however, portions of the plasma may tend to fill the entire chamber. The plasma generally goes where it can be sustained, which is almost everywhere in the chamber. By way of example, the plasma may fill the areas below the substrate such as the bellows of the pumping arrangement (e.g., non-active region). If the plasma reaches these areas, etch, deposition and/or corrosion of the areas may ensue, which may lead to particle contamination inside the process chamber, i.e., by etching the area or flaking of deposited material.

Furthermore, an unconfined plasma tends to form a non uniform plasma, which may lead to variations in the process performance, i.e. etch uniformity, overall etch rate, etch profile, micro-loading, selectivity, and the like. In order to reduce the aforementioned effects, a plasma confinement arrangement may be used to confine the plasma. By way of example, a plasma confinement arrangement that may be used in the examplary plasma processing system for confining a plasma is described in greater detail in a co-pending patent application entitled, "METHOD AND APPARATUS FOR CONTROLLING THE VOLUME OF PLASMA", Application Ser. No. 09/439,759, filed on even date and incorporated herein by reference.

Figure 3:
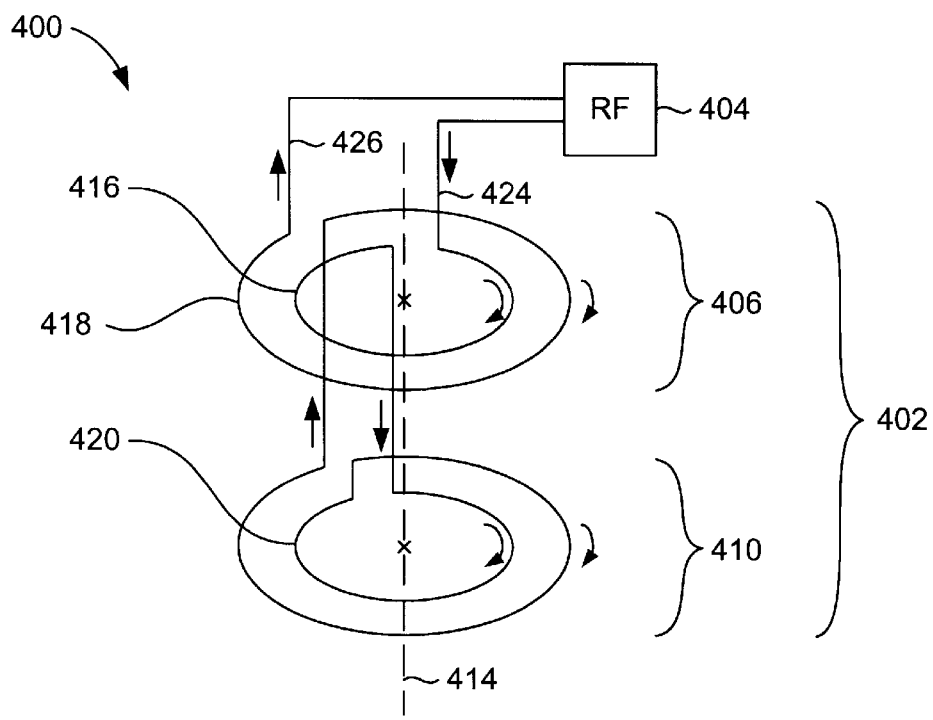
FIG. 3 illustrates the multi-turn antenna arrangement, in accordance with one embodiment of the present invention.
Figure 4:
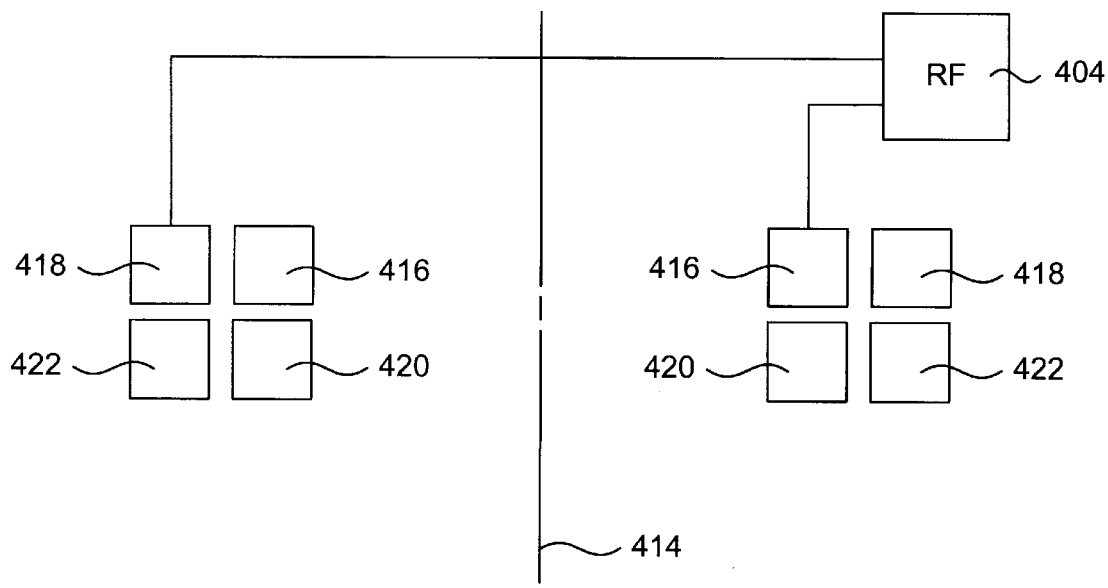
FIG. 4 is a cross sectional side view of the Multi-turn antenna arrangement, in accordance with one embodiment of the present invention.

According to a first aspect of the invention, the plasma processing apparatus is provided with a multi-turn antenna arrangement such that an azimuthally symmetric electric field is induced inside the process chamber of the plasma processing apparatus. FIGS. 3 & 4 illustrate a multi-turn antenna arrangement 400, in accordance to one embodiment of the present invention. The multi-turn antenna arrangement 400 includes a multi-turn antenna 402 operatively coupled to a RF power source 404 which, for example, respectively correspond to the antenna 210 and the RF power source 214 illustrated in FIG. 2.

As mentioned, if the antenna length is small with respect to the wavelength then the transmission line description of the power coupling is no longer appropriate, and the power coupling begins to behave as a lumped circuit element. Therefore, multi-turn antenna 402 is configured to have a length that is smaller than the wavelength of the transmitted energy. By decreasing the length of the antenna, fewer nodes are created in the standing wave pattern, and as a result the high voltage and low voltage areas in the azimuthal direction of the antenna are substantially reduced.

The multi-turn antenna is preferably configured to have multiple turns that are closely disposed together so the electromagnetic field that is produced appears to be from a single turn antenna. More specifically, by placing the turns closer together the current producing capacity of the antenna is increased. For example, if the antenna is formed of four turns that are proximal to one another then the current through the plasma tends to be about four times as strong as in the antenna. Correspondingly, this concentrated current carries over to a concentrated plasma that is more uniform. As a result, the diameter of the antenna, with respect to the diameter of the process chamber, can be made smaller, which in turn decreases the length of the antenna. The actual size of the antenna will be described in greater detail below.

Multi-turn antenna 402 is substantially circular and includes at least a first pair of concentric loops 406 in a first plane and a second pair of concentric loops 410 in a second plane. Preferably, the first pair of concentric loops 406 and the second pair of concentric loops 410 are substantially identical and symmetrically aligned with one another along an antenna axis 414. It should be noted that a substantially circular antenna will produce a substantially circular electric field, which as result will produce a substantially circular plasma. Accordingly, because the process chamber and the substrate are circular it stands to reason that the substantially circular plasma tends to create more uniform processing at the surface of the substrate.

While the present invention has been shown and described as being substantially circular, it should be understood that alternate shapes for applications requiring different shaped substrates such as for displays or for compensation of some asymmetry in chamber design may be used. By way of example, oval shapes, or rectangular shapes with circular corners following the same principles set forth above may also work well.

Furthermore, the first pair of concentric loops 406 are preferably stacked above the second pair of concentric loops 408. Single-plane antennas typically produce an increased amount of capacitive coupling because the terminal voltage and all of the voltage nodes are in direct proximity with the window. However, because of the stacked antenna and the symmetric alignment between the first pair of concentric loops and the second pair of concentric loops, the high terminal voltage is advantageously shielded by the second pair of concentric loops. More specifically, the voltage drop (e.g., capacitive coupling) that would typically occur between the first concentric loop and the plasma is substantially reduced because the second pair of concentric loops provides a conductive path for the voltage drop and therefore the voltage drop will not interact with the plasma.

Additionally, first pair of concentric loops 406 preferably include a first turn 416 and a fourth turn 418, and second pair of concentric loops 410 preferably include a second turn 420 and a third turn 422. Further, first turn 416 is substantially identical to and disposed above second turn 420, and fourth turn 418 is substantially identical to and disposed above third turn 422.

First turn 416 is operatively coupled to second turn 420, second turn 420 is operatively coupled to third turn 422, and third turn 422 is operative coupled to fourth turn 418, with each of the turns being arranged so that the current flow is in the same direction around antenna axis 414. In one implementation, the multi-turn antenna is formed from a single conductive element. However, it should be noted that this is not a limitation and that the multi-turn antenna may be formed from separate parts that are structurally and electrically coupled together. Additionally, multi-turn antenna 402 includes an input lead 424 and an output lead 426. The input lead 424 is operatively coupled to first turn 416, and the output lead 426 is operatively coupled to fourth turn 418. Accordingly, RF current is made to flow through multi-turn antenna 402 by applying an RF voltage between the input lead 424 and the output lead 426.

Still referring to FIGS. 3 & 4, fourth turn 418 has a larger diameter than first turn 416, and third turn 422 has a larger diameter than second turn 420. Although the outer turns (e.g., third and fourth turns), have larger diameters they are preferably disposed proximate to the inner turns (e.g., first and second turns). That is, the fourth turn 418 is preferably arranged to be proximate to the first turn 416, and the third turn 418 is preferably arranged to be proximate to the second turn 420. As a result of their close proximity, the multi-turn antenna looks and acts like a single turn antenna (e.g., substantially no space between turns). Accordingly, the high or low current areas in the radial direction are substantially reduced.

As is well known to those skilled in the art, a small space between two conductors will typically create arcing between the two conductors. Therefore, the space between the outer and inner turns is limited by a distance that eliminates arcing. However, in one implementation of the present invention, the space is filled with a dielectric material to allow the inner and outer turns to be disposed as close as possible to one another, while substantially eliminating arcing between the inner and outer turns. By way of example, Teflon or ceramic materials having a space between about 0.2 to about 1 cm. work well.

Furthermore, the multi-turn antenna is generally formed from copper. In one implementation, the multi-turn antenna is formed from copper coated with silver. However, it should be noted that the multi-turn antenna is not limited by copper or copper coated with silver and that any suitable conductive metal may be used. In one embodiment, the cross section of the antenna loop is rectangular to facilitate a repeatable location of each loop with respect to the window and each other loop. However, it should be noted that the this is not a limitation and that other cross sectional shapes and sizes may be used. Alternatively, the antenna loop may be formed from a hollow conductor to facilitate temperature control (i.e., flowing a fluid therethrough).

With respect to the overall size of the multi-turn antenna, i.e., the outer diameter, it is generally preferable (but not absolutely necessary) to size the antenna to be smaller than the cross-section of the process chamber in order to keep the plasma concentrated in the region above the substrate and to prevent undue plasma diffusion to the chamber walls, which disadvantageously requires more power to operate the plasma processing system and increases wall erosion. Furthermore, the size of the plasma to be generated generally corresponds to the size of the antenna used, and therefore, the multi-turn antenna should have an outer diameter that is substantially similar to the diameter of the substrate in order to produce a uniform etch rate. By way of example, the size of the substrates are typically between about 6 to about 12 inches and therefore in one embodiment, the multi-turn antenna has an outer diameter between about 6 to about 12 inches.

To elaborate further, because of the increased current capacity, i.e., multi-turn antenna that acts like a single turn, the multi-turn antenna may be configured to be smaller than the substrate. That is, the higher concentration of current tends to produce a plasma that is large enough to process the substrate. It should be understood however that the use of smaller antennas may not be required for all processes, i.e., an antenna may be configured to be larger than the substrate. However, if a high degree of uniformity is critical, the use of smaller antennas can be quite beneficial. By way of example, the diameter of the antenna may be configured to be between about 6 to about 15 inches, and preferably between about 7 to about 11 inches, in order to process a 12 inch substrate. It should be noted, however, that this is not a limitation and that the actual size of the antenna may vary according to the specific size of the substrate (e.g., the antenna size may be scaled as needed when smaller or larger substrates are involved) and the specific design of each plasma processing system.

With respect to the RF frequency employed, as a general guideline, a lower RF frequency (e.g., less than 13 MHz) tends to decrease the effects of the transmission line characteristics of the power coupling by reducing standing wave effects. That is, a lower frequency tends to make any inherent azimuthally asymmetric coupling characteristic of an antenna less pronounced. Furthermore, at a lower RF frequency, the capacitive coupling between the antenna and the plasma is also less pronounced, and therefore ion bombardment of the coupling window is reduced. Therefore, the frequency of the RF power source is generally configured to be less than or equal to about 13 MHz, preferably between about 0.4 MHz and about 13 MHz, and more preferably, at about 4 MHz. It should be understood that the use of lower frequencies may not be required for all processes. However, if a high degree of uniformity is critical, the use of low frequencies can be quite beneficial.

As can be seen from the foregoing, the advantages of the first aspect of the invention are numerous. Different embodiments or implementations may have one or more of the following advantages. One advantage of the invention is that an azimuthally symmetric plasma is produced inside the process chamber. As a result, increased process uniformity is achieved, which increases substrate throughput, reduces device failure, and increases the overall productivity of the substrates being processed. Another advantage of the invention is that the inventive antenna arrangement is self shielding, and therefore the capacitive coupling between the antenna and the plasma is reduced. Correspondingly, the ion bombardment of the coupling window is reduced, and therefore the life of the coupling window is increased, and particle contamination associated with ion bombardment is reduced.

Figure 5:
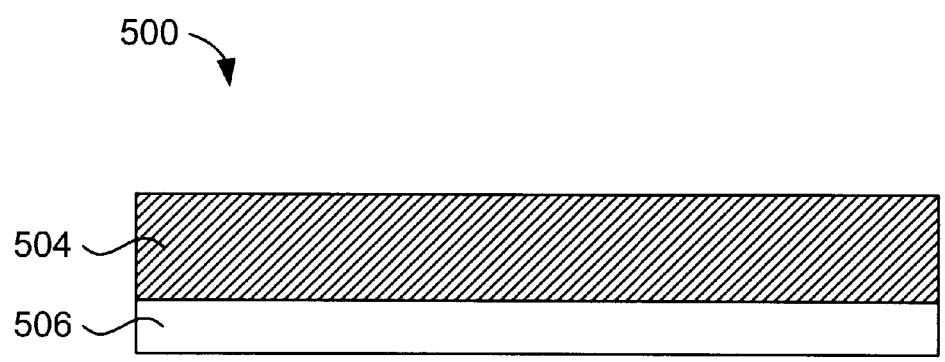
FIG. 5 is a cross sectional side view of the multi-layered coupling window, in accordance with one embodiment of the present invention.

According to a second aspect of the invention, a plasma processing apparatus is provided with a multi-layered coupling window arrangement to substantially reduce capacitive coupling between the antenna and the plasma. To facilitate discussion of this aspect of the present invention, FIG. 5 illustrates a multi-layered coupling window arrangement 500, in accordance with one embodiment of the present invention. The multi-layered coupling window arrangement 500 may respectively correspond to the coupling window 212 illustrated in FIG. 2. Multi-layered coupling window 500 includes at least a first layer 504 and a second layer 506. Preferably, first layer 504 is bonded to second layer 506. In one implementation, the two layers are thermally bonded together. However, it should be noted that a this is not a limitation and that other bonding processes may be used. Alternatively, it should be noted that a gap may be disposed between the layers, i.e., a vacuum gap or a gap to allow gas flow between the layers, while still obtaining the benefits described. Furthermore, second layer 506 preferably forms part of the inner peripheral surface of the process chamber.

Referring first to the second layer, the second layer is configured to act as an electrostatic shield that reduces the potential difference on its surface. Further, the second layer is arranged to be electrically isolated and preferably formed from a conducting or semi-conducting material that can facilitate the passage of inductive RF energy from the antenna to the plasma. Additionally, because the second layer is exposed to the plasma inside the process chamber, the second layer is preferably formed from a material that is substantially resistant to a plasma. In a preferred embodiment, the second layer is formed from Silicon Carbide (SiC). For the most part, SiC can resist the thermal, chemical and physical effects of plasma processing. In addition, SiC is generally classified as a dielectric, yet yields some resistance to the flow of current. The resistive property is what produces the shielding effect, and the dielectric property is what allows inductive coupling.

The resistivity of the second layer is an important parameter for ensuring that the layer act as an electrostatic shield, while not impacting the inductive electric field. For the most part, the particular resistivity range to be used in the invention depends on the exact dimensions of the antenna with which the coupling window is being used, the operating frequency of the power coupling and the thickness of the second layer. By way of example, a resistivity from about 100 ohm-cm to about 10 kohm-cm works well. However, it should be understood that if desired, the resistivity can be configured to be greater than $10^6$ ohm-cm to make the second layer (e.g., SiC) act more like a dielectric layer.

While not wishing to be bound by theory, it is believed that the electrical resistance of the second layer presents an equipotential surface to the process gas used to form the plasma. For example, after ignition of the plasma, the potential on the second layer is substantially reduced due to the proximity of the plasma to the second layer. Furthermore, a capacitive voltage divider is generally formed, for example, an upper part, which is formed by the dielectric first layer having a constant capacitance, and a lower part, which is formed by the conductive second layer and the chamber walls before ignition and the conductive second layer and the plasma after ignition. Before ignition the lower part has a small capacitance, and therefore there is a large voltage aiding ignition (e.g., in order to initiate the discharge, a capacitive electric field is typically necessary). After ignition the lower part has a large capacitance such that the voltage is substantially reduced, and therefore it does not lead to significant capacitive power coupling.

Referring now to the first layer, the first layer is preferably formed from a dielectric material that can facilitate the passage of inductive RF energy from the antenna to the plasma. Further, the first layer is configured to be strong enough to structurally hold vacuum and robust enough to be easily handled during periodic cleaning of the chamber. Additionally, the first layer is generally formed from a dielectric material that has superior thermal properties to enable temperature control of the window. By way of example, dielectric materials formed from Silicon Nitride (SiN) or Aluminum Nitride (AlN) work well. However, it should be understood that this is not a limitation and that other materials may be used. For example, alumina and quartz may also work well.

The overall thickness of the multi-layer coupling window 500 is configured to be thin enough to effectively transmit the antenna RF energy to the plasma, while being sufficient to withstand the pressures and heat that are generated during processing. Preferably, the thickness of the multi-layer coupling window is between about 0.5 and about 1 inch. More preferably, the thickness of the multi-layer coupling window is about 0.8 inches. Further, the first layer 504 should have a thickness greater than the second layer 506. Preferably, the thickness of the first layer is between about 0.5 and about 1 inches. More preferably, the thickness of the first layer is about 0.6 inches. Furthermore, the thickness of the second layer is preferably between about 0.1 and about 0.5 inches. More preferably, the thickness of the second layer is about 0.2 inches. It should be understood that the actual thickness of layers may vary according the specific material chosen for each layer.

In one embodiment, the second layer is configured to cover the entire first layer to protect the first layer from plasma exposure, and to ensure that pure materials (e.g., SiC) face the plasma region that is in contact with the substrate. However, it should be noted that this is not a limitation and that other configurations may be used. For example, the second layer may be configured to cover only those portions of the first layer that face the plasma near the antenna.

Note that there is no requirement that the size of the coupling window be equal to the size of the plasma processing chamber. In general, however, a small coupling window may reduce cost, particular when expensive materials such as SiC are employed. In one embodiment, the shape of the window coupling is configured to coincide with the shape of the antenna arrangement, and therefore, the coupling window is configured to be substantially circular. In another embodiment, the outer dimensions of the coupling window may be configured to extend a small distance beyond the outer dimensions of the antenna, in order to reduce any coupling to electrically conductive elements which may encircle the antenna. In one example, the outer dimensions of the coupling window is arranged to extend about 1 inch past the outer dimensions of the antenna. In yet another embodiment, the coupling window may have a shape that is substantially the same as the antenna, i.e., hoop shaped.

With respect to the dielectric properties (e.g., dielectric constant) employed, as a general guideline, a lower dielectric constant, e.g., less than about 10 tends to decrease the effects of the transmission line characteristics of the power coupling by reducing standing wave effects. More specifically, a lower dielectric constant tends to make the wavelength of the transmitted energy longer, which makes the antenna look shorter and therefore fewer nodes are created in the standing wave pattern. Accordingly, a lower dielectric constant tends to make any inherent azimuthally asymmetric coupling characteristic of an antenna less pronounced.

In one embodiment, the overall dielectric constant of the coupling window is preferably configured to be less than or equal to about 10. It should be understood that the use of lower dielectric constants may not be required for all processes. In fact, a compromise between the desire for highly azimuthal symmetry and the simplicity of structural and thermal design is typically needed. However, if a high degree of uniformity is critical, the use of low dielectric constants can be quite beneficial.

As can be seen from the foregoing, the advantages of the second aspect of the invention are numerous. Different embodiments or implementations may have one or more of the following advantages. For example, the invention provides a coupling window that substantially reduces the capacitive coupling between the antenna and the plasma. As a result, variations in the plasma are substantially reduced. For example, the inductive coupling coefficient is typically maintained, the ion bombardment of the coupling window is generally reduced, and more power is available for plasma generation, i.e., a higher plasma density for a given power. Furthermore, because ion bombardment is reduced, particle contamination associated with ion bombardment is generally reduced, and as a result, process variations associated with a varying thickness window (i.e., deposits or removed material) are decreased. Additionally, the present invention utilizes pure materials, i.e., SiC, which tend to reduce process variations.

Furthermore, it is contemplated that additional elements may be employed, along with the aforementioned multi-turn antenna and multi-layered coupling window, to further enhance the uniform processing of a substrate in a plasma processing system. By way of example, a magnetic arrangement can be arranged with the multi-turn antenna to control the radial variation of the static magnetic field within the process chamber in the region proximate the coupling window and the multi-turn antenna. An example of such an magnetic arrangement may be found in co-pending patent application entitled, "IMPROVED PLASMA PROCESSING SYSTEMS AND METHODS THEREFOR". Ser. No. 09/439,661, filed on even date and incorporated herein by reference.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing apparatus for processing a substrate with a plasma, comprising:

a first RF power source having a first RF frequency;

a process chamber;

a substantially circular antenna operatively coupled to said first RF power source and disposed above a plane defined by said substrate when said substrate is disposed within said process chamber for said processing, said substantially circular antenna being configured to induce an electric field inside said process chamber with a first RF energy generated by said first RF power source, said substantially circular antenna including at least a first pair of concentric loops in a first plane and a second pair of concentric loops in a second plane, said first pair of concentric loops and said second pair of concentric loops being substantially identical and symmetrically aligned with one another, said substantially circular antenna forming an azimuthally symmetric plasma inside said process chamber; and a coupling window disposed between said antenna and said process chamber, said coupling window being configured to allow the passage of said first RF energy from said antenna to the interior of said process chamber, said coupling window having a first layer and a second layer, said second layer being configured to substantially suppress the capacitive coupling formed between said substantially circular antenna and said plasma, said substantially circular antenna and said coupling window working together to produce a substantially uniform process rate across the surface of said substrate.

2. The plasma processing apparatus as recited in claim 1 wherein said first pair of concentric loops is proximate to said second pair of concentric loops.

3. The plasma processing apparatus as recited in claim 1 wherein said first pair of concentric loops are stacked above said second pair of concentric loops.

4. The plasma processing apparatus as recited in claim 3 wherein said second pair of concentric loops shields a terminal voltage that is produced by said first pair of concentric loops.

5. The plasma processing apparatus as recited in claim 1 wherein said first pair of concentric loops has a first turn and a fourth turn, said second pair of concentric loops has a second turn and a third turn, said fourth turn having a larger diameter than said first turn and said third turn having a larger diameter than said second turn, said first turn being substantially identical to said second turn, and said third turn being substantially identical to said fourth turn, said first turn being disposed above said second turn, and said fourth turn being disposed above said third turn, said first turn being operatively coupled to said second turn, said second turn being operatively coupled to said third turn, said third turn being operative coupled to said fourth turn, each of said turns being arranged so that the current flow in each of said turns is in the same direction.

6. The plasma processing apparatus as recited in claim 5 wherein said first turn is proximate to said fourth turn and said second turn is proximate to said third turn, said proximity of said first turn to said fourth turn, and said second turn to said third turn substantially reducing radial variations in said substantially circular antenna.

7. The plasma processing apparatus as recited in claim 1 wherein said substantially circular antenna is aligned symmetrically about the center of said process chamber and said substrate when said substrate is disposed inside said process chamber, and wherein said substantially circular antenna is disposed above said substrate when said substrate is disposed inside said process chamber.

8. The plasma processing apparatus as recited in claim 1 wherein said substantially circular antenna is disposed proximate to said coupling window.

9. The plasma processing apparatus as recited in claim 1 wherein said first layer and said second layer of the coupling window are bonded together.

10. The plasma processing apparatus as recited in claim 1 wherein said second layer forms part of the inner peripheral surface of said process chamber.

11. The plasma processing apparatus as recited in claim 1 wherein said first layer is formed from a dielectric material.

12. The plasma processing apparatus as recited in claim 11 wherein said first layer is formed from a material selected from the group consisting essentially of Silicon Nitride or Aluminum Nitride.

13. The plasma processing apparatus as recited in claim 1 wherein said second layer is formed from a conductive material.

14. The plasma processing apparatus as recited in claim 13 wherein said second layer is formed from SiC having a resistivity from about 100 ohm-cm to about 10,000 ohm-cm.

15. The plasma processing apparatus as recited in claim 1 wherein said second layer said is formed from a material that is substantially resistant to said plasma present within said process chamber during said processing.

16. The plasma processing apparatus as recited in claim 15 wherein said second layer is formed from SiC.

17. The plasma processing apparatus as recited in claim 1 wherein said second layer is configured to be electrically floating.

18. The plasma processing apparatus as recited in claim 1 wherein said first RF frequency being configured at about 4 MHz.

19. The plasma processing apparatus as recited in claim 1 wherein said process chamber is a substantially cylindrical plasma processing chamber.

20. An antenna arrangement for generating an electric field inside a process chamber, said antenna arrangement comprising:
a first loop disposed around an antenna axis;
a second loop coupled to said first loop, said second loop having a geometry that is substantially similar to a geometry of said first loop, said second loop being disposed below said first loop and around said antenna axis such that said first and second loops are symmetrically aligned relative to said antenna axis, said first and second loops being arranged to carry a current therethrough, wherein each of the loops are arranged to the flow current in the same direction around said antenna axis.

21. The antenna arrangement as recited in claim 20 wherein said first RF frequency is configured at about 4 MHz.

22. A coupling window arrangement for processing a substrate with a plasma inside a process chamber, said coupling window being disposed between an antenna and said process chamber, said antenna being configured for generating RF energy, said generating forming capacitive coupling between said antenna and said plasma, said coupling window arrangement comprising:
a first layer being formed from a dielectric material; and
a second layer bonded to said first layer, said second layer being formed from a material that is substantially resistant to said plasma present within said process chamber during said processing, said second layer forming part of the inner peripheral surface of said process chamber,
said first layer and said second layer being, configured to allow the passage of said RF energy from said antenna to the interior of said process chamber.

23. The coupling window arrangement as recited in claim 22 wherein said second layer is configured to substantially suppress said capacitive coupling formed between said antenna and said plasma during said generating.

24. The coupling window arrangement as recited in claim 23 wherein said second layer is formed from a conductive material.

25. The plasma processing apparatus as recited in claim 24 wherein said second layer is formed from SiC having a resistivity from about 100 ohm-cm to about 10,000 ohm-cm.

26. The coupling window arrangement as recited in claim 22 wherein said second layer is formed from a dielectric material.

27. The coupling window arrangement as recited in claim 26 wherein said second layer is formed from SiC having a resistivity of greater than $10^6$ ohm-cm.

28. The plasma processing apparatus as recited in claim 22 wherein said first layer is formed from a material selected from the group consisting essentially of Silicon Nitride or Aluminum Nitride.

29. The plasma processing apparatus as recited in claim 22 wherein said second layer is formed from SiC.

30. The plasma processing apparatus as recited in claim 22 wherein said second layer is configured to be electrically floating.

31. The antenna arrangement as recited in claim 20 wherein said first and second loops comprise a plurality of concentric turns.

32. The antenna arrangement as recited in claim 31 wherein said first loop has at least a first turn and a fourth turn, and said second loop has at least a second turn and a third turn, said first and second turns having a substantially similar first geometry and said third and fourth turns having a substantially similar second geometry, said first turn being disposed above said second turn and said fourth turn being disposed above said third turn, the loops being arranged so that the current flows from the first turn to the second turn, from the second turn to the third turn, and from the third turn to the fourth turn.

33. The antenna arrangement as recited in claim 32 wherein said third and fourth turns are position further away from said antenna axis than said first and second turns.

34. The antenna arrangement as recited in claim 33 wherein said third and fourth turns are positioned proximate the first and second turns.

35. The antenna arrangement as recited in claim 34 wherein a dielectric medium is disposed between each of the turns so as to eliminate arcing therebetween.

36. The antenna arrangement as recited in claim 20 wherein the first and second loops have a combined length that is smaller than the wavelength of energy transmitted through the antenna arrangement.

37. The antenna arrangement as recited in claim 20 wherein said second loop effectively shields a terminal voltage of said first loop.

38. The antenna arrangement as recited in claim 20 wherein said first and second loops cooperate to form an azimuthally symmetric electric field inside a process chamber with a first RF energy generated by a first RF power source, wherein said azimuthally symmetric electric field forms a substantially azimuthally symmetric plasma, which produces a substantially uniform process rate across the surface of a substrate disposed inside of said process chamber.

39. The antenna arrangement as recited in claim 20 wherein said first loop is positioned in a first plane and said second loop is positioned in a second plane.

40. A plasma processing apparatus for processing a substrate, comprising:

a process chamber in which a plasma is both ignited and sustained for said processing;

a multi-layered antenna configured to produce an electric field via RF energy inside said process chamber, said antenna having a top loop and a bottom loop, which are substantially similar to one another, and which are symmetrically aligned relative to an antenna axis; and a multi-layered window configured to allow the passage of said RF energy from said antenna to said process chamber, said window having a first layer and a second layer, said second layer being arranged to suppress capacitive coupling, which may occur between said plasma and said antenna.

* * * * *